United States Patent
Kuchta et al.

(10) Patent No.: US 7,509,053 B2
(45) Date of Patent: *Mar. 24, 2009

(54) IMPEDANCE MATCHING CIRCUIT WITH SIMULTANEOUS SHIELDING OF PARASITIC EFFECTS FOR TRANSCEIVER MODULES

(75) Inventors: Daniel M. Kuchta, Patterson, NY (US); Mark B. Ritter, Danbury, CT (US); Albert E. Ruehli, Chappaqua, NY (US); Christian Schuster, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/875,332

(22) Filed: Oct. 19, 2007

(65) Prior Publication Data
US 2008/0037993 A1 Feb. 14, 2008

Related U.S. Application Data

(63) Continuation of application No. 10/727,817, filed on Dec. 4, 2003.

(51) Int. Cl.
*H04B 10/02* (2006.01)
(52) U.S. Cl. ...................................... 398/135
(58) Field of Classification Search ................. None
See application file for complete search history.

(56) References Cited

U.S. PATENT DOCUMENTS

| | | | |
|---|---|---|---|
| 7,412,172 B2* | 8/2008 | Kuchta et al. ............... | 398/135 |
| 2004/0091268 A1* | 5/2004 | Hogan et al. ................ | 398/117 |
| 2004/0227583 A1* | 11/2004 | Shaffner et al. ............. | 333/32 |
| 2005/0201711 A1* | 9/2005 | Koh et al. ................... | 385/137 |

OTHER PUBLICATIONS

Diefenderfer, A. James. Principles of Electronic Instrumentation. 2nd ed. Philadelphia, Pennsylvania: Saunders College Publishing, 1979.*

* cited by examiner

*Primary Examiner*—Kenneth N Vanderpuye
*Assistant Examiner*—David S Kim
(74) *Attorney, Agent, or Firm*—Keusey, Tutunjian & Bitetto, P.C.; Anne V. Dougherty, Esq.

(57) ABSTRACT

A method for fabricating a transceiver, which simultaneously provides impedance matched transmission for radio frequency (RF) and shields against transmission losses due to parasitic effects includes identifying parasitic electromagnetic elements associated with an RF choke for a given placement on a substrate. RF lines are placed and dimensioned on the bench to form impedance matched RF lines wherein a portion of the RF lines shield the RF choke for a given bandwidth such that impedance matching and control of parasitic effects of the RF choke are simultaneously provided wherein an intermediate capacitance formed between the RF choke and the shield is sized to balance against the parasitic effects to provide a desired transmission response over a selected frequency range.

5 Claims, 8 Drawing Sheets

IMPEDANCE MATCHING CIRCUIT WITH SIMULTANEOUS SHIELDING OF PARASITIC EFFECTS FOR TRANSCEIVER MODULES

RELATED APPLICATION INFORMATION

This application is a Continuation application of U.S. patent application Ser. No. 10/727,817 filed on Dec. 4, 2003, pending.

BACKGROUND

1. Technical Field

Aspects of the present invention relate to optical transceiver modules, and more particularly to a wideband impedance matching circuit design that simultaneously provides a high bandwidth signal path from a laser diode driver to a laser diode and shields against parasitic effects from a DC current supply of the laser diode.

2. Description of the Related Art

Laser diodes operating in high data rate optical transceivers or transmitters need a wideband high-frequency (AC or RF) connection to the laser diode driver circuit which sends the data to be transmitted, and a DC current supply connection to the laser diode for establishing the operating point.

Some optical modules establish the operating point through RF lines, which require higher biasing voltage and produce higher power dissipation.

For the optical modules where DC and RF are connected using different circuits the following considerations may apply. The RF lines demand a careful design over the bandwidth of the signal to be transmitted (here up to 15 GHz for a 10 Gb/s application). The DC connection is less sensitive, but presents additional challenges for the RF design since it must be decoupled for the entire frequency range (e.g., above 10 MHz or in general $1 \times 10^{-4}$ of the data rate).

This decoupling is done by so-called RF chokes which are commercially available. RF chokes represent a low impedance path for DC currents but a high impedance path for RF signals. However, parasitic electromagnetic effects (capacitive coupling and inductive voltage drops) associated with the placement and design of RF chokes can disable the decoupling and hence degrade signal transmission to the laser diode.

SUMMARY

Parasitic capacitance to ground of RF choke pads ($C_g$) together with parasitic inductance ($L_b$) of bonding wires, which connect to the laser, form a resonant circuit which creates a parallel (shunt) low impedance path to high-frequency signals at its resonance frequency. The resonance frequency can be approximated by:

$$f_{res} = \frac{1}{2\pi\sqrt{L_b * C_g}}$$

Typical values for $f_{res}$ can be as low as several GHz.

Increasing the resonance frequency $f_{res}$ by lowering the values of the parasitic elements $C_g$ and $L_b$ is only possible up to a certain limit. The size of the RF chokes, the minimum bonding wire distance and other design or manufacturing constraints usually set a lower limit to the parasitic inductance and capacitance values. Hence, the full operating bandwidth of the device can usually not be made free of any parasitic RF choke resonances.

It may be noted that not only bonding wires, but any electrical connection between laser diode and RF choke will have a parasitic inductance. As a consequence, the considerations outlined above apply to different electrical connections as well, e.g. ribbon wires or direct attachment.

Therefore, a transceiver or other RF device includes a signal layer disposed over a ground plane having radio frequency (RF) transmission lines configured and dimensioned to provide impedance matching along the RF lines. A shield is formed as a part of the RF lines and disposed below an RF choke of a DC current supply to form an intermediate capacitance between the choke and the shield to control parasitic effects.

A method for fabricating a transceiver, which simultaneously provides impedance matched transmission for radio frequency (RF) and shields against transmission losses due to parasitic effects, includes the steps of identifying parasitic electromagnetic elements associated with an RF choke for a given placement on a transmission path, and placing and dimensioning the RF lines on the transmission path to form impedance matched RF lines wherein a portion of the RF lines shield the RF choke for a given bandwidth such that impedance matching and control of parasitic effects of the RF choke are simultaneously provided.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Systems and methods for wideband impedance matching and circuit designs are provided for optical transceiver modules that simultaneously provide a high bandwidth signal path to the laser diode and a shield against parasitic effects from the DC current supply of the laser diode. Aspects of the present invention are based on a co-design of the electrical high-frequency signal lines and the DC current supply lines. One embodiment utilizes a specific implementation of a Wheatstone bridge where the shielding is acting as a bypass (speed-up) capacitor.

Parasitic effects may occur whenever there is a metallic plane, also known as a ground plane, underneath an optical transceiver module circuit. In accordance with one embodiment, an impedance matching circuit presented herein is implemented on silicon. However, the substrate material may include other materials, for example, ceramics, organics, printed or flexible circuit boards, etc. Also, the DC current supply does not have to be on a separate submount or of the shape and size presented hereinbelow.

Figure 1:
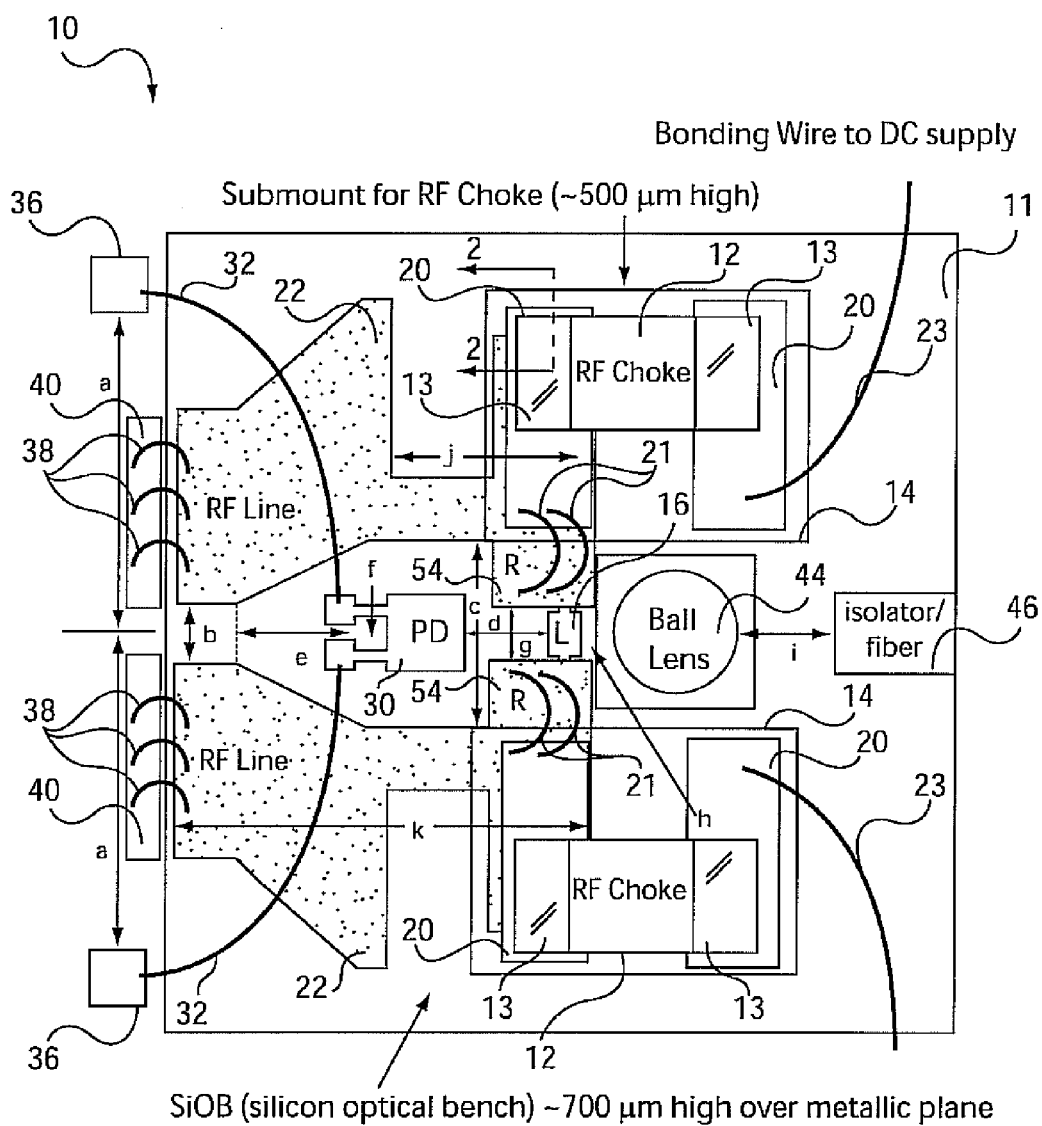
FIG. 1 is a top view of an illustrative transceiver in accordance with one illustrative embodiment.

Referring now in detail to the figures in which like numerals represent the same or similar elements and initially to FIG. 1, a transceiver assembly or other device 10 includes an optical bench or substrate 11 and is shown in accordance with one embodiment. Assembly 10 includes RF chokes 12 placed on submounts 14, e.g., small pieces of dielectric material, with suitable metallic pads 20 for round or ribbon bond wiring. The submount size is preferably kept as small as possible to permit a placement close to a laser diode 16. The submount height and material are preferably chosen for an appropriate manufacturing process and easy attachment to the optical bench 11.

Location and/or modification of the RF choke submount 14 are arranged such that parasitic capacitance can be shielded and hence reduced, by the RF line design. This means metallic contacts 20 of the submount 14 are placed over RF lines 22 and as close as possible to the laser diode 16.

Identification of the parasitic electromagnetic elements associated with the RF chokes 12 and their placement in the design is performed and is used to influence the placement and design of the impedance matching circuitry. The parasitic elements include a parasitic inductance of the electrical path from choke 12 to laser 16, for example wires 21, and a parasitic capacitance including the RF choke terminals 13 and a ground plane (not shown) of the optical bench 10 (both the RF choke terminals 13 and any metallic pad 20 that they are located on contribute to this capacitance). Bonding wires 23 connect the RF chokes to the DC power supply (not shown).

The parasitic capacitance influences the design of the impedance matching circuit 22 such that a portion of the circuit shields the RF choke 12 over a desired bandwidth. The design of circuit may be iteratively adjusted to meet the desired specifications to achieve sufficient shielding of the parasitic capacitance by the RF lines 22.

Assembly 10 does not try to directly reduce the parasitic elements; instead it shields the RF choke elements 12 that contribute to the parasitic capacitance to ground, which effectively eliminates a resonant circuit, which would otherwise cause the parasitic effects.

A photodiode 30 is connected to control circuitry through connections 32. Connections 32 are bonded or otherwise connected to traces 36 (external to bench 11). Similarly, connections 38 connect RF lines 22 to traces 40 formed off optical bench 11. DC blocking capacitors can be provided before connections 38 to prevent DC biasing of the AC source, e.g. the laser diode driver. A laser diode 16 is placed in a gap (d) between RF lines 22. A lens 44, such as a ball lens is mounted adjacent to laser 16 for focusing the output signal into an isolator 46 or optical fiber (not shown).

Figure 2:
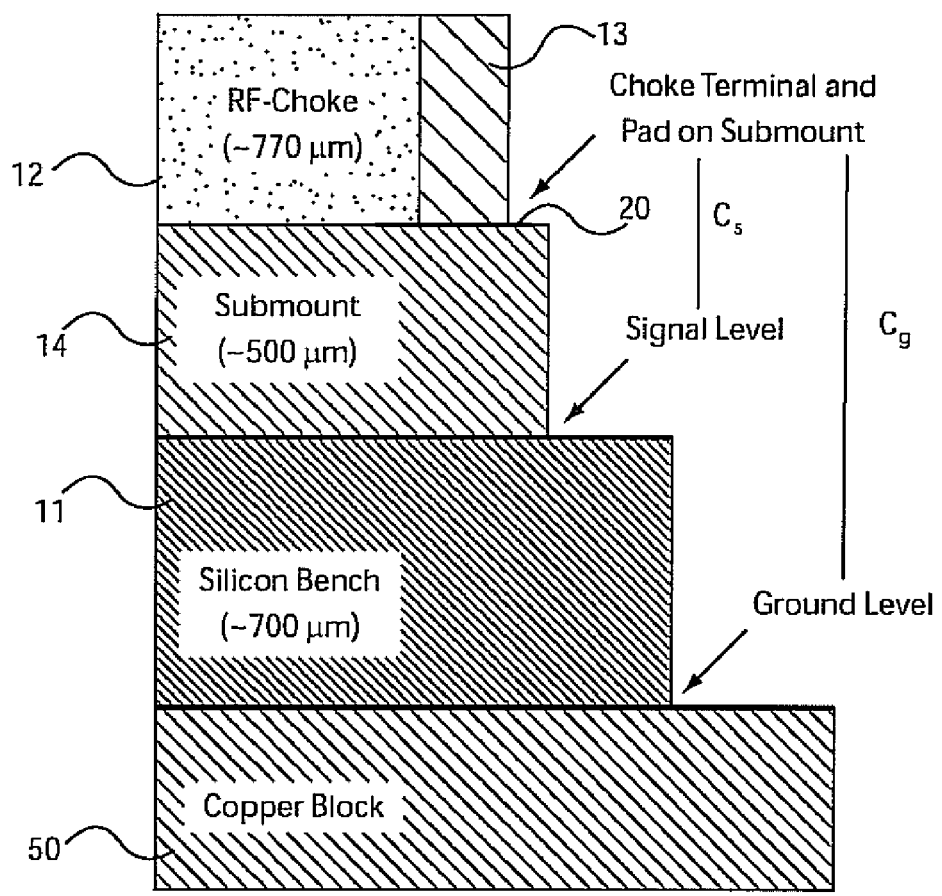
FIG. 2 is a cross-sectional view taken at section line 2-2 of FIG. 1.

In one embodiment, bench 11 is formed from high resistivity silicon (e.g., about 1 kOhm-cm). Ceramic or organic substrates may also be employed. FIG. 2 shows a cross-section of assembly 10 taken through a section line 2-2 in FIG. 1.

Referring to FIG. 2, in the embodiment shown, a silicon bench 11 is mounted on a conductive block 50. Block 50 is preferably formed from a highly conductive material such as a metal, and particularly, copper or its alloys. Other suitable materials may include gold, silver or other metals and their alloys. Block 50 is maintained at ground potential or functions as an AC ground reference for bench 11. Submount 14 is mounted on bench 11. Bench 11 includes RF lines 22 and forms the signal layer. RF choke 12 is mounted on submount 14. A choke terminal 13 and pad 20 on submount 14 form capacitances both to the signal layer ($C_s$) and the ground layer ($C_g$), the latter being parasitic. By simultaneously balancing these capacitances, the advantages of aspects of the present invention are realized. Namely, impedance matched RF signal transmission is achieved from a laser diode driver (not shown) to laser diode and a DC biasing of the laser diode 16 without any detrimental effect on the RF signal transmission. This is achieved through the design of the complex shape of RF lines 22.

In particular, RF lines 22 include dimensions which provide a matched impedance for incoming RF signals, yet prevent such signals from being lost due to parasitics in the DC power connections as in prior art systems.

Figure 3A:
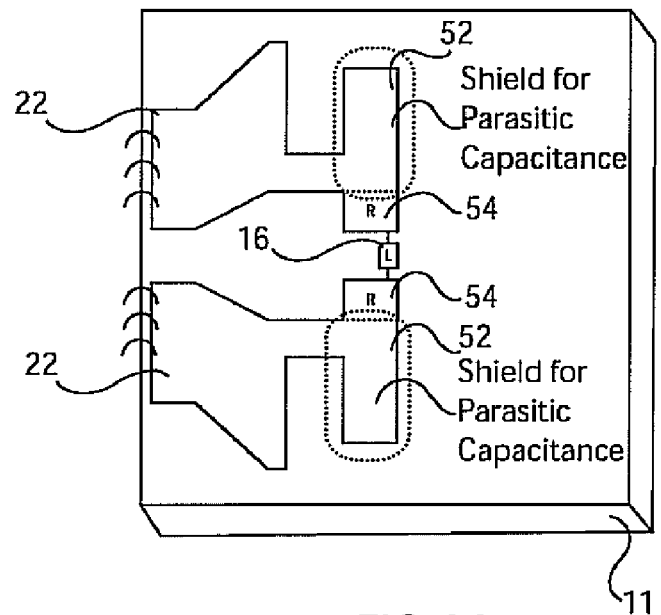
FIG. 3A is a top view showing a signal layer with impedance matched RF lines, which form a shield in accordance with an illustrative embodiment.

To further illustrate the advantages of one embodiment, FIG. 3A schematically shows features of RF lines 22 which provide impedance matching and shielding to counter parasitic inductance and capacitance.

Figure 3B:
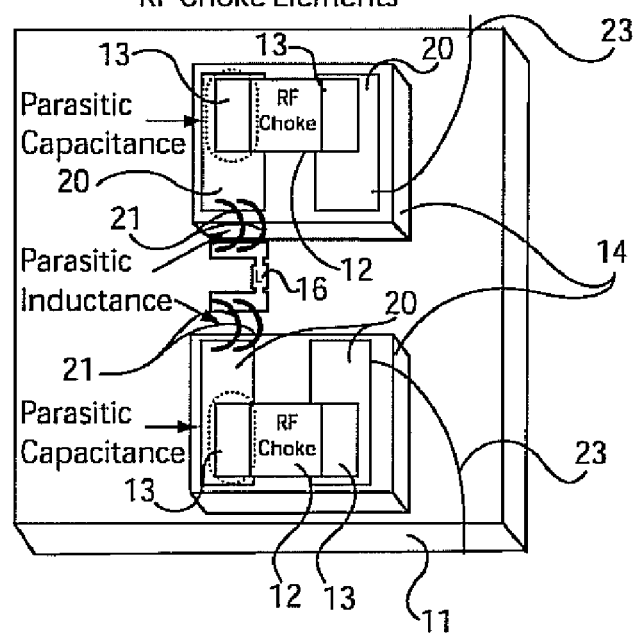
FIG. 3B is a top view showing a DC current supply path with RF choke elements and further showing areas of potential parasitic elements.

Referring to FIG. 3A, a signal layer includes RF lines 22. RF lines 22 are geometrically configured to provide an impedance-matched network for an AC signal path. In addition, a portion 52 of line 22 provides shielding to reduce $C_g$ by introducing a capacitance $C_s$ between pad 20 of submount 14 and the signal layer (e.g., RF lines 22) as illustratively shown in FIG. 3B. Note that FIG. 3B, eliminates signal layer features for illustrative purposes. By its geometric dimensions, lines 22 are determined to permit AC power to a laser without power loss due to parasitics of the DC supply path over a range of acceptable operation frequencies (e.g., 2-20 GHz).

Figure 4:
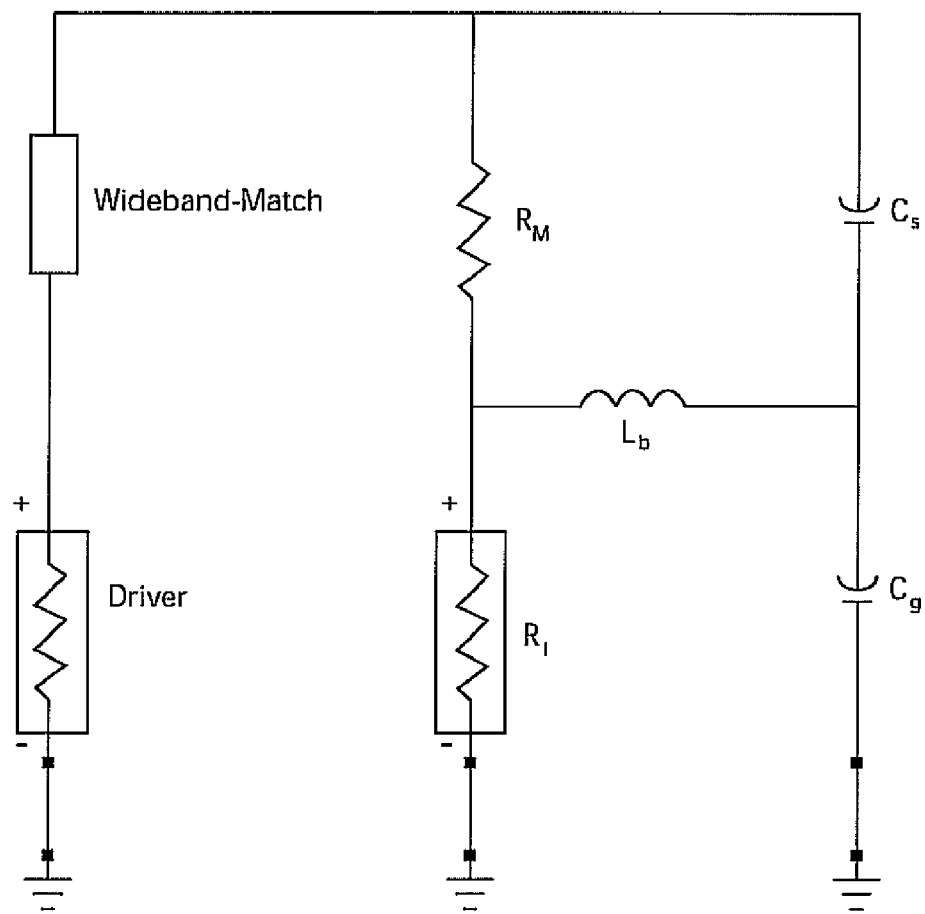
FIG. 4 is a schematic diagram showing parasitic elements including a shield capacitor formed in accordance with an aspect of the present invention.

Referring to FIG. 4, an equivalent circuit is illustratively shown to demonstrate advantages of preferred embodiments. Providing a shield (52 in FIG. 3A) introduces an intermediate capacitance ($C_s$). $R_m$ represents a resistor that provides a match of a low impedance laser diode $R_l$ to a laser diode driver (Driver), which may include, for example, a thin film resistor 54 (FIG. 3A). $C_g$ is the parasitic capacitance of the RF choke to ground and $L_b$ is the parasitic inductance of the connection between laser diode (16) and RF choke (12). The RF choke impedance is assumed to be much higher than both $R_m$ and $R_l$ for high frequencies and is therefore not considered here for simplicity. "Wideband-Match" is a modeled impedance which accounts for the geometric effects of RF lines 22.

In the unshielded case, i.e., without $C_s$, $C_g$ and $L_b$ form a resonant circuit, which offers a parallel low impedance path to the high-frequency signals at its resonance frequency. This leads to a loss of transmitted energy. Advantageously, introduction of the shield 52 (FIG. 3A) will have at least two effects. First, $C_g$ will be reduced, and second, a bypass (speed-up) capacitance $C_s$ across the matching resistor $R_m$ is introduced. By doing so a complex Wheatstone Bridge like circuit is created with $R_m$ and $R_l$ being the one branch and $C_s$ and $C_g$ being the other.

The following cases can now be distinguished:
1) $C_s/C_g < R_1/R_m$ Shielding is below a target value. There will be a loss in transmission.
2) $C_s/C_g = R_1/R_m$ The shielding is exactly on target ($L_b$ is without current). Transmission is flat.
3) $C_s/C_g > R_1/R_m$ Shielding is above target. There is a peak in transmission.

Figure 5:
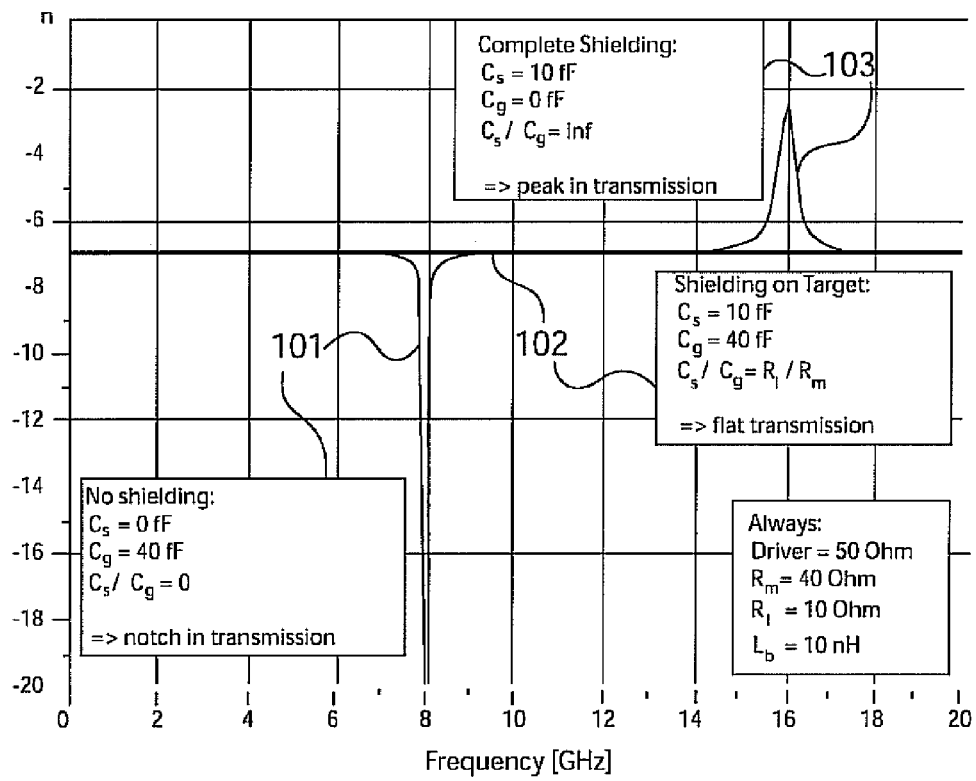
FIG. 5 is an S-parameter plot in dB versus frequency for three transmission cases of the equivalent circuit in FIG. 4.

Referring to FIG. 5, equivalent circuit simulations were performed for all three of the above cases. Values were selected to provide distinction for the three cases. Magnitudes for parameters in the illustration include: Driver=50 Ohm, $R_m$=40 Ohm, $R_1$=10 Ohm and $L_b$=10 nH.

In case 1, no shielding, $C_s$=0, $C_g$=40 fF and $C_s/C_g$=0. Plot 101 shows a notch in transmission on a graph of transmission (dB) versus frequency (GHz).

In case 2, shielding on target, $C_s$=10 fF, $C_g$=40 fF and $C_s/C_g = R_1/R_m$. Plot 102 shows a flat response in transmission on a graph of transmission (dB) versus frequency (GHz).

In case 3, complete shielding, above target $C_s$=10 fF, $C_g$=0 fF and $C_s/C_g$=infinite. Plot 103 shows a peak response in transmission on a graph of transmission (dB) versus frequency (GHz).

The shielding, in accordance with aspects of this disclosure, is accomplished by an integral part of the design, namely the RF lines 22 on the silicon optical bench 11 where the laser is located. The RF lines 22 and the RF choke submount 14 are designed and placed such that the shielding is exactly on or above target (e.g., $C_s/C_g = R_1/R_m$) while impedance match is preserved, and impedance match is a function of the physical geometry of RF lines 22.

Simulation and Measurement of Prototype

Referring again to FIG. 1, a prototype of one illustrative embodiment was constructed and tested. The prototype included the features of FIG. 1 with the following features (Dimensions in microns):

| | |
|---|---|
| Silicon Optical Bench (11) | 5,100 × 5,100 × (about 700 high) |
| Laser-Diode (L) (16) | 200 × 300 |
| RF Choke (12)/Terminals (13) | 1,524 × 762/380 × 762 |
| RF lines (22) (widths) | 1,250, 1,550, 400, 1,300 |
| Resistors (R) (54) | 600 × 246 |
| Submounts (14) | 2,050 × 1,600 × (about 500 high) |
| Pads on submounts (20) | 525 × 1,400 |

Distance designated by letters in microns:

| | |
|---|---|
| a. center axis to Photo-Diode (PD) pad | 2,100 |
| b. RF line to RF line (min.) | 400 |
| c. RF line to RF line (max.) | 1,200 |
| d. space for laser (L) | 308 |
| e. Y-branch length | 800 |
| f. Y-branch to PD | 200 |
| g. PD to L | 500 |
| h. L to ball lens | 200 |
| i. Ball lens to isolator | 615 |
| j. Impedance matched RF line length | 600 + 650 |
| k. Overall RF line length | 2,650 |

The prototype included a silicon optical bench (about 700 microns in thickness) with a metallic ground plane (FIG. 2) on the bottom, RF lines 22 on the top, and a submount 14 holding the RF chokes 12. RF lines 22 and submount pads 20 have been co-designed to optimize shielding. The RF chokes 12 used were a 0603 standard size having a minimum impedance of 200 Ohm out to 8 GHz.

Figure 6:
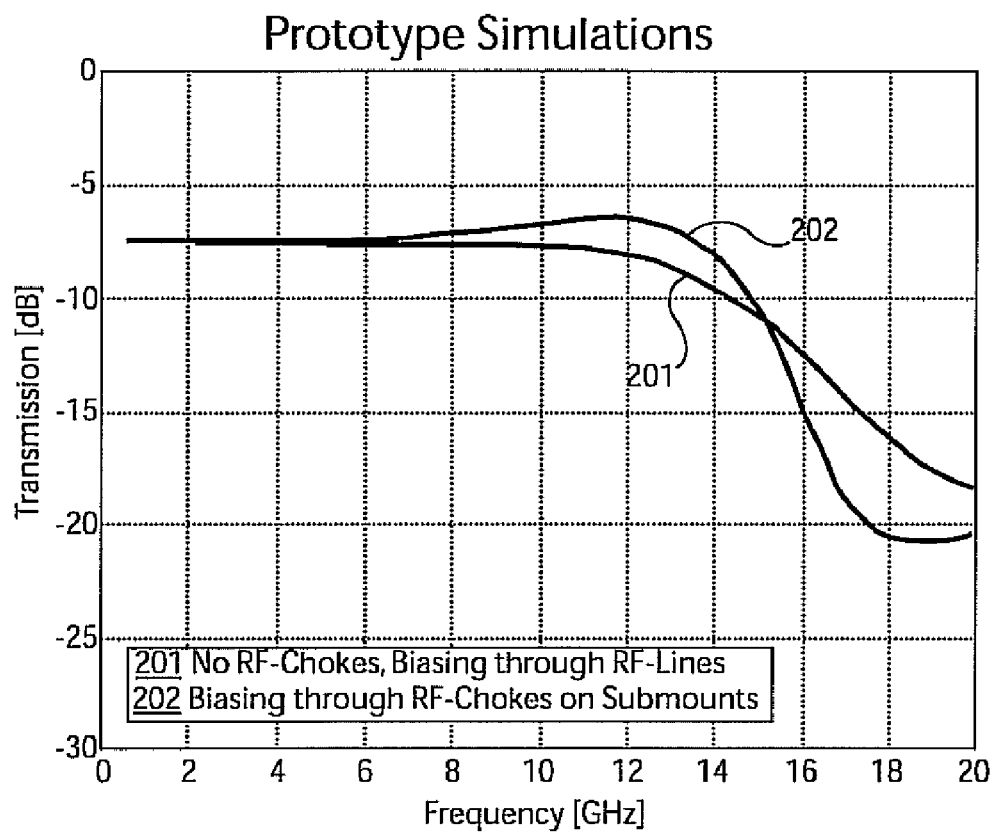
FIG. 6 is an S-parameter plot in dB versus frequency for simulated transmission of a prototype design.
Figure 7:
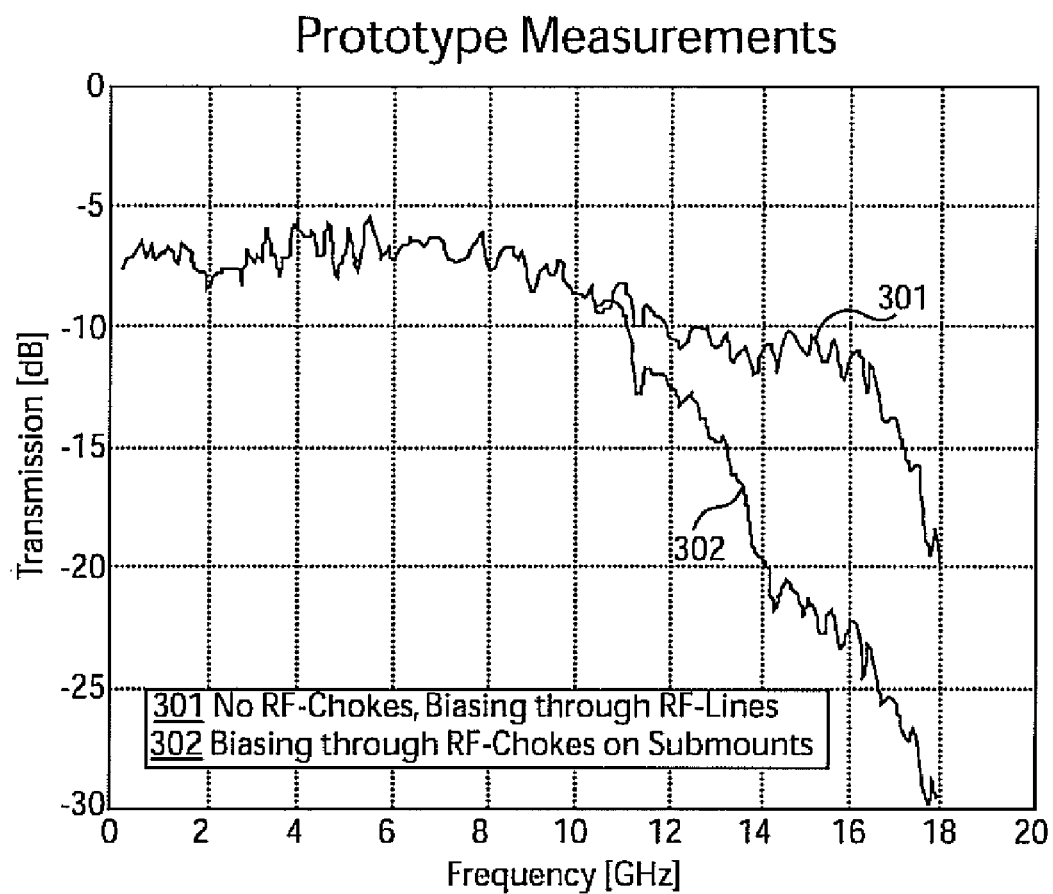
FIG. 7 is an S-parameter plot in dB versus frequency for measured transmission of a prototype design.

Referring to FIGS. 6 and 7, the overall shielding effect realized in the prototype with the features listed above was simulated to be acceptable up to 15 GHz (FIG. 6). The prototype with the RF choke submounts (curve 202 of FIG. 6) performs similar or better than the one without RF chokes (curve 201 of FIG. 6) up to 15 GHz. Simulations were done by using a 3D frequency-domain full-wave electromagnetic solver where the RF choke component was modeled as an infinite impedance.

Measurements (FIG. 7) show that the prototype with the RF choke submounts (curve 302) performs similar to the one without RF chokes (curve 301) up to 11 GHz. Above 11 GHz a continuous decrease in transmission can be noticed; however, there is no notch in transmission.

Figure 8:
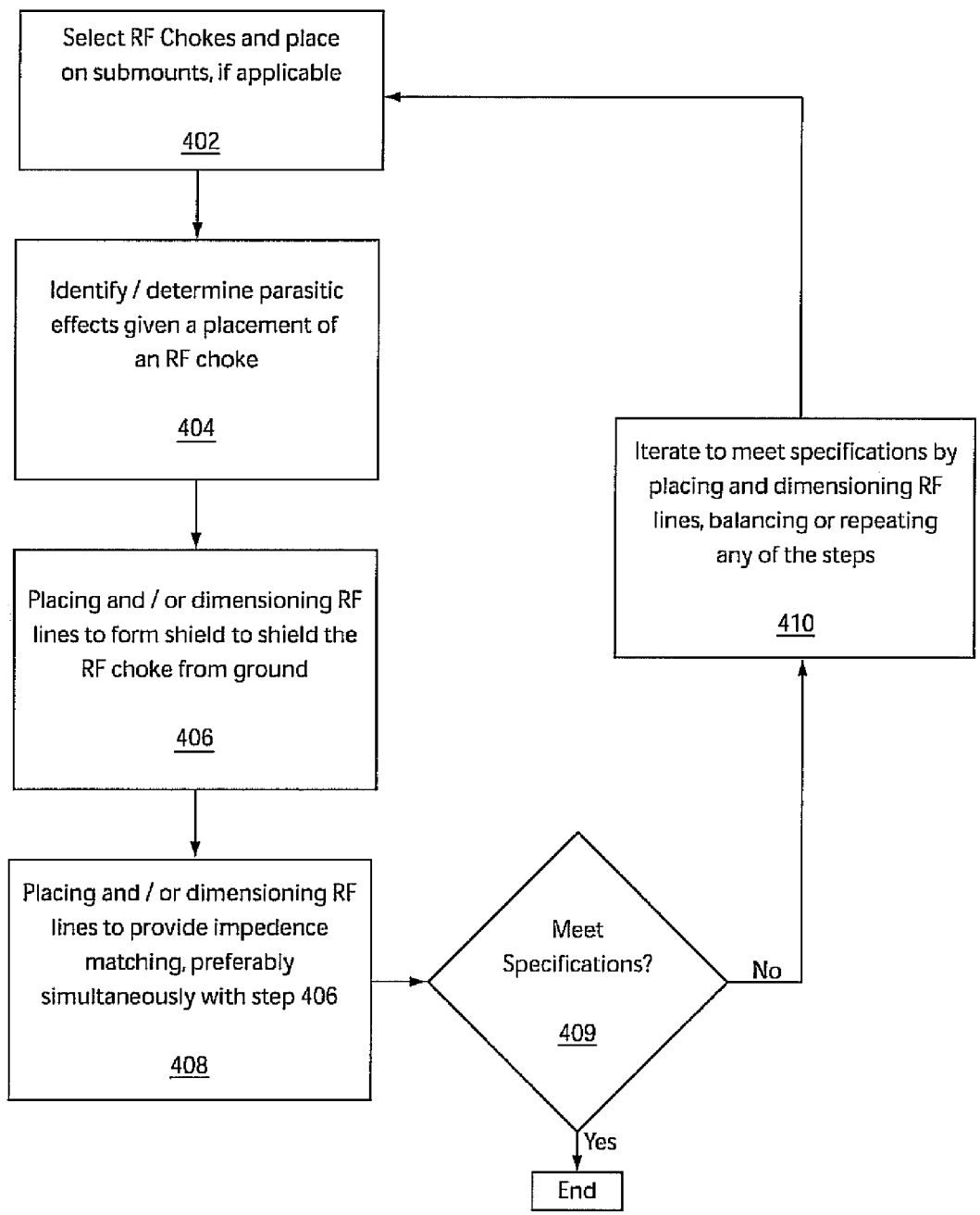
FIG. 8 is a block/flow diagram for fabricating a transceiver, which simultaneously provides impedance-matched transmission for radio frequency (RF) and shields against transmission losses due to parasitic effects.

Referring to FIG. 8, a method for fabricating a device, which simultaneously provides an impedance matched transmission line for RF and shields against parasitic effects, is illustratively shown. In block 402, RF chokes may be placed on submounts. Submounts include pieces of dielectric material, with suitable metallic pads for bond or ribbon wiring. The submount size is preferably held to as small a size as possible to permit placement close to the laser diode, e.g., within a few hundred microns. The submount height and material should be chosen for the appropriate manufacturing process and easy attachment to the optical bench.

In block 404, identification of the parasitic electromagnetic elements associated with the RF chokes and their placement in the design is determined. These elements may include a parasitic inductance including the electrical path from choke to laser (for example bonding wires) and a parasitic capacitance including the RF choke contacts and the ground plane of the optical bench (both the RF choke terminals and any metallic pad which they are located on contribute to this capacitance). The parasitic capacitance will be affected in the next step.

In block 406, location and/or modification of the RF choke submount is performed such that the parasitic capacitance can be shielded, i.e. reduced, by the RF line. This may include locating the metallic contacts of the submount over the RF lines and as close as possible to the laser diode.

In block 408, an impedance matching circuit (RF lines) is designed (e.g., including the placement and dimensioning of the RF lines) such that the RF lines shield the RF choke over a desired bandwidth. If the design does not meet the desired specifications, in block 409, the above steps may be repeated until a sufficient shielding of the parasitic capacitance by the RF lines is achieved in block 410.

It is to be understood that the present disclosure describes particular embodiments for illustrative purposes. Other embodiments are also contemplated and may include some of the following features. Optical benches may be formed from organic, ceramic or other suitable materials. Optical benches may have different sizes and shapes for the RF lines. RF choke submounts may include different orientation, size, thickness, shape and dielectric material. RF chokes may be of different size and shape. For example smaller chokes may be employed. Integrated chokes may also be employed which take advantage of the shielding effect (that is, for example, chokes that are monolithically integrated with the silicon optical bench). Designs may include RF chokes, which are directly placed on the RF line without an intermediate submount. This may mean no bonding wires are needed. Instead, the electrical contact could be established by solder or conductive adhesive, for example.

In other embodiments, the RF chokes may be directly placed on the optical bench without an intermediate submount. The bonding wires may be directly attached to the RF choke terminals, and the shielding may be achieved by fabricating the RF lines on a lower plane than the plane the RF choke is mounted on, e.g., a V-groove is etched in the silicon below the first terminal of the RF choke.

In other embodiments, the present method and system may be employed with optical or electrical outputs for a given bench setup or assembly. In other words, RF signals may be received and provide AC power for a device, while DC power may be additionally employed for yet another device, and the output may be either an electrical or optical signal. This may include the use of high frequency transistors. In addition, a whole circuit (RF and DC) may be integrated on a chip. Aspects of the present invention are not limited to optical benches and may be applied to any RF bias-T application or RF environment device. In one such example, embodiments may be applied for optical modulators or other devices.

Having described preferred embodiments for an impedance matching circuit with simultaneous shielding of parasitic effects for transceiver modules (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a transceiver, which simultaneously provides impedance matched transmission for radio frequency (RF) and shields against transmission losses due to parasitic effects, comprising the steps of:

identifying parasitic electromagnetic elements associated with an RF choke for a given placement on a substrate;

placing and dimensioning RF lines on a bench to form impedance matched RF lines wherein a portion of the RF lines shield the RF choke for a given bandwidth such that impedance matching and control of parasitic effects of the RF choke are simultaneously provided wherein an intermediate capacitance formed between the RF choke and the shield is sized to balance against the parasitic effects to provide a desired transmission response over a selected frequency range wherein the intermediate capacitance and impedances of the parasitic effects form a circuit which controls the parasitic effects; and balancing between the intermediate capacitance versus the parasitic effects to provide a flat or peaked transmission response over a selected frequency range, wherein the balancing includes establishing $C_s/C_g \geq R_l/R_m$ where $C_s$ is the intermediate capacitance, $C_g$ is a parasitic capacitance between the choke and the ground plane, $R_m$ is a matching resistor and $R_l$ is the load.

2. The method as recited in claim 1, further comprising the step of iteratively modifying the placing and dimensioning of the RF lines to meet specifications.

3. The method as recited in claim 1, wherein the parasitic effects include a parasitic inductance for an electrical path from the RF choke to a laser and a parasitic capacitance between the RF choke and ground plane.

4. The method as recited in claim 1, further including a submount for the RF choke and further comprising the step of modifying the RF choke submount location such that a parasitic capacitance of the RF choke to ground is shielded.

5. The method as recited in claim 1, wherein the transceiver is an optical transceiver.

* * * * *